(12) United States Patent
Xu et al.

(10) Patent No.: US 9,812,375 B2
(45) Date of Patent: Nov. 7, 2017

(54) COMPOSITE SUBSTRATE WITH ALTERNATING PATTERN OF DIAMOND AND METAL OR METAL ALLOY

(71) Applicant: II-VI INCORPORATED, Saxonburg, PA (US)

(72) Inventors: Wen-Qing Xu, Medfield, MA (US); Chao Liu, Butler, PA (US); Giovanni Barbarossa, Saratoga, CA (US); Elgin E. Eissler, Renfrew, PA (US); Thomas E. Anderson, Morristown, NJ (US); Charles J. Kraisinger, Saxonburg, PA (US); Norbert Lichtenstein, Langnau a. Albis (CH)

(73) Assignee: II-VI Incorporated, Saxonburg, PA (US)

( * ) Notice: Subject to any disclaimer, the term of this patent is extended or adjusted under 35 U.S.C. 154(b) by 0 days.

(21) Appl. No.: 15/011,805

(22) Filed: Feb. 1, 2016

(65) Prior Publication Data
US 2016/0233142 A1 Aug. 11, 2016

Related U.S. Application Data

(60) Provisional application No. 62/112,296, filed on Feb. 5, 2015.

(51) Int. Cl.
*H01L 23/373* (2006.01)
*H01L 23/498* (2006.01)
(Continued)

(52) U.S. Cl.
CPC ...... *H01L 23/3732* (2013.01); *H01L 23/3736* (2013.01); *H01L 23/49838* (2013.01); *H01L 23/49866* (2013.01); *H01L 23/49894* (2013.01); *H01L 24/83* (2013.01); *H01L 33/641* (2013.01); *H01L 24/16* (2013.01); *H01L 24/29* (2013.01); *H01L 24/32* (2013.01); *H01L 24/40* (2013.01); *H01L 25/0655* (2013.01);
(Continued)

(58) Field of Classification Search
CPC . H01L 2224/16225; H01L 2224/32225; H01L 23/3732; H01L 2224/05647; H01L 2224/05684; H01L 2924/10254
USPC .......................................... 257/720; 438/479
See application file for complete search history.

(56) References Cited

U.S. PATENT DOCUMENTS 8,531,026 B2 * 9/2013 Sung .................. H01L 23/3732
257/720
9,287,220 B2 3/2016 Nam
(Continued)

FOREIGN PATENT DOCUMENTS

KR 1020150002264 A 1/2015

*Primary Examiner* — Jonathan Han
(74) *Attorney, Agent, or Firm* — The Webb Law Firm

(57) ABSTRACT

A composite substrate includes a submount substrate of an alternating pattern of electrically insulative portions, pieces, layers or segments and electrically conductive portions, pieces, layers or segments, and a shaft, back or plate for supporting the alternating pattern of electrically insulative portions and electrically conductive portions. An active device having a P-N junction can be mounted on the submount substrate. The electrically insulative portions, pieces, layers or segments can be formed from diamond while the electrically conductive portions, pieces, layers or segments can be formed from a metal or metal alloy.

22 Claims, 9 Drawing Sheets

(51) Int. Cl.
*H01L 33/64* (2010.01)
*H01L 25/065* (2006.01)
*H01L 23/00* (2006.01)

(52) U.S. Cl.
CPC .. *H01L 33/642* (2013.01); *H01L 2224/16227* (2013.01); *H01L 2224/291* (2013.01); *H01L 2224/2919* (2013.01); *H01L 2224/32225* (2013.01); *H01L 2224/40139* (2013.01); *H01L 2224/40151* (2013.01); *H01L 2224/73263* (2013.01); *H01L 2224/8347* (2013.01); *H01L 2224/8348* (2013.01); *H01L 2224/83424* (2013.01); *H01L 2224/83438* (2013.01); *H01L 2224/83439* (2013.01); *H01L 2224/83444* (2013.01); *H01L 2224/83447* (2013.01); *H01L 2224/83455* (2013.01); *H01L 2224/83463* (2013.01); *H01L 2224/83466* (2013.01); *H01L 2224/83469* (2013.01); *H01L 2224/83471* (2013.01); *H01L 2224/83479* (2013.01); *H01L 2224/83484* (2013.01); *H01L 2224/83493* (2013.01); *H01L 2224/83801* (2013.01); *H01L 2224/83851* (2013.01); *H01L 2924/10329* (2013.01); *H01L 2924/12041* (2013.01); *H01L 2924/12042* (2013.01)

(56) References Cited

U.S. PATENT DOCUMENTS

| | | |
|---|---|---|
| 2002/0033189 A1 | 3/2002 | Macris |
| 2008/0248596 A1 | 10/2008 | Das et al. |
| 2010/0043304 A1* | 2/2010 | Lee ................. B23D 65/00 51/309 |
| 2010/0102442 A1* | 4/2010 | Sung ................ H01L 23/3732 257/720 |
| 2010/0208431 A1* | 8/2010 | Dugas ............... F28F 13/18 361/709 |
| 2011/0024767 A1* | 2/2011 | Sung ................ H01L 21/568 257/77 |
| 2012/0168206 A1 | 7/2012 | Sekine et al. |
| 2016/0003563 A1* | 1/2016 | Dutta ............... H01L 23/3732 165/185 |
| 2016/0049351 A1* | 2/2016 | McCann ........... H01L 23/3732 257/76 |

* cited by examiner

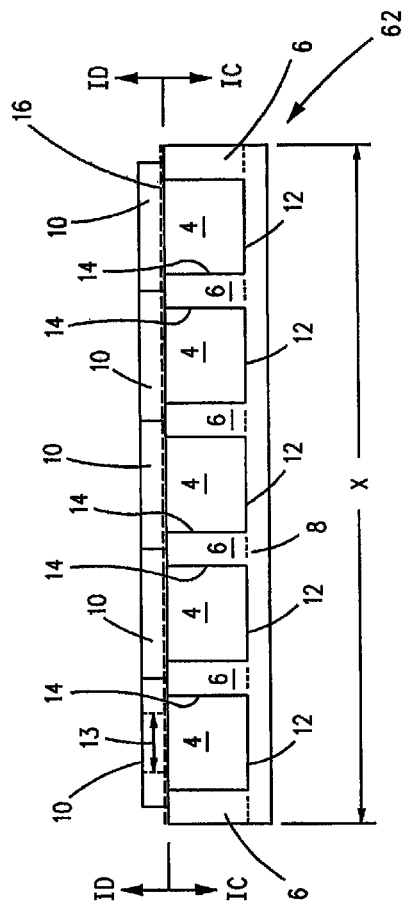

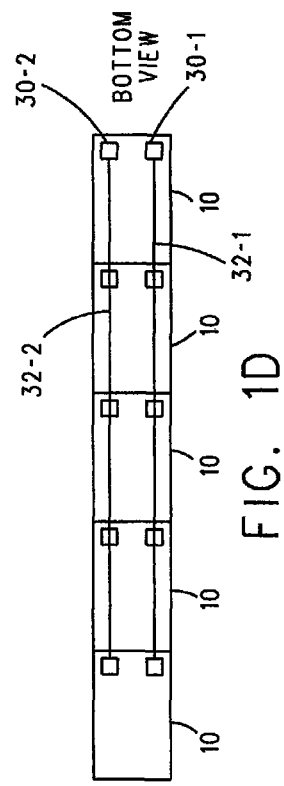
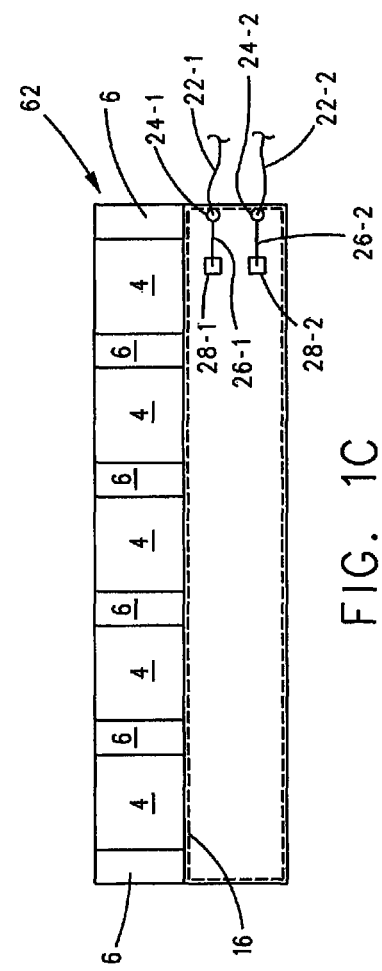

COMPOSITE SUBSTRATE WITH ALTERNATING PATTERN OF DIAMOND AND METAL OR METAL ALLOY

CROSS REFERENCE TO RELATED APPLICATION

This application claims the benefit of U.S. Provisional Application No. 62/112,296, filed Feb. 5, 2015, entitled "Composite Substrate Comprising an Alternated Pattern of at least a Diamond Portion and at least a Metal Portion", which is incorporated herein by reference.

BACKGROUND OF THE INVENTION

Field of the Invention

The present invention relates to a composite substrate comprised of an alternating pattern of electrically insulating material and electrically conductive material. More specifically, a composite substrate comprises an alternating pattern of diamond and metallic portions, pieces, or segments.

Description of Related Art

Active electronic devices that include P-N junctions generate heat in operation. Examples of such active devices include a semiconductor laser, a light-emitting diode, and a laser diode. Such heat should desirably be removed promptly to avoid undesirable temperature rises in the active device which can negatively impact the temporary or long-term performance of the active device.

In an example, in connection with a laser diode, a temperature change can lead to a wavelength shift of the laser light being produced by the laser diode. Such wavelength shift, even subtle, can be undesirable. In an example, a high power laser diode can have an electrical energy to light conversion efficiency between 10% to 50%. The rest of the electrical energy is converted to heat which needs to be removed, otherwise the semiconductor junction temperature rises to an undesirable level. In addition, temperature rise due to insufficient heat removal has a direct influence on the output wavelength and bandgap. In an example, for a temperature change of every three degrees centigrade, the wavelength of a diode laser can change by nearly 1 nm. In addition, the output power of the laser diode can decrease as the temperature increases.

Typically, such active devices are coupled to a submount substrate which aids in the removal of heat via various bonding mechanisms, such as, for example, adhesive or solder. In an example, where the active device is a semiconductor laser or a laser diode, the coefficient of thermal expansion (CTE) of the materials forming such active device can range between $3 \times 10^{-6}$ meters/meters-degree Kelvin (m/m-K) to $7 \times 10^{-6}$ m/m-K. In contrast, the submount substrate material to which such active devices are mounted can have a CTE between 10 to $25 \times 10^{-6}$ m/m-K, depending upon the material selected to form the submount substrate. As can be seen from this example, there is a significant mismatch between the CTE of the material forming the active device (between 3 and $7 \times 10^{-6}$ m/m-K) and the CTE of the material forming the submount substrate (between 10 and $25 \times 10^{-6}$ m/m-K).

It is known in the art that differences in CTE between the material of the active device and the submount substrate mentioned above can result in bonding failure between the active device and the submount substrate in response to changes in temperature of the active device during its operation. To avoid this problem, heretofore, the CTEs of the materials forming the submount substrate and the active device were chosen to be as close as possible. However, these efforts have not produced satisfactory results.

Heretofore, a real challenge existed in achieving a close CTE match between the material(s) of a submount substrate and the material(s) of an active device, while simultaneously attaining efficient heat removal from the active device via selecting a submount substrate material that was highly thermally conductive. In one example of the prior art, the CTE of a submount substrate can be tuned by making a metallic composite of copper-tungsten, copper-molybdenum, etc. The CTE of Cu—W and Cu—Mo can be tuned to between $6 \times 10^{-6}$ m/m-K and $9 \times 10^{-6}$ m/m-K from copper CTE of $17 \times 10^{-6}$ m/m-K, depending on the percentage of copper level. For example, 15% copper in tungsten has a CTE of $7.2 \times 10^{-6}$ m/m-K, while its thermal conductivity is about 210 W/m-K. In another example, 20% copper in molybdenum has a CTE of $7.5 \times 10^{-6}$ m/m-K, while its thermal conductivity is only about 165 W/m-K.

One of the most thermally conductive materials is diamond having a thermal conductivity as high as 2,200 W/m-K or greater. Accordingly, diamond is an ideal material for heat removal from an active device. However, diamond has a CTE of about $1 \times 10^{-6}$ m/m-K, substantially deviating from the CTE of an active device material (between 3 and $7 \times 10^{-6}$ m/m-K). Accordingly, a temperature rise during operation of an active device mounted on a diamond submount substrate produces thermal compression stress on the active device. Such thermal stress due to CTE mismatch between the active device and the diamond submount substrate can lead to undesirable bonding failure of the active device to the diamond submount substrate.

In another example, the CTE of a submount substrate can be tuned by making a composite of diamond particles within a metal or metallic matrix, such as aluminum, copper, and/or silver. The diamond volume percentage of such composite can reach as high as 70% in such metal or metallic matrix. The thermal conductivity of such composite of diamond particles and metal or metallic matrix can range from 300 to 650 W/m-K, never reaching a theoretically thermal conductivity value of the composite (determined by a linear model by giving a volume percentage of diamond particles and the volume percentage of the metal matrix). For a composite of 70 volume percent diamond particles and 30 volume percent copper as a matrix, the theoretical thermal conductivity, using a linear model, is calculated to be about 1,320 W/m-K.

It is believed that the inability to achieve such theoretical thermal conductivity of the composite of diamond particles and metallic copper matrix can be due to voids and/or interface materials between the surface of diamond particles and the metallic matrix. In an example, direct mix and melt of diamond particles and metal or metallic matrix can lead to formation of voids on the interfaces of diamond particles and the metal or metallic matrix, resulting in a lower loading of diamond particles, which, in-turn, can lead to a lower thermal conductivity. The surface of the diamond particles can be modified with an interface material such as, for example, a layer of silicon carbide, tungsten carbide, molybdenum carbide, or other any other suitable metal carbide, which allows higher loading of diamond particles into the metal or metallic matrix. However, the thermal conductivity of such interface material is typically significantly lower than the thermal conductivity of diamond. In an example, the thermal conductivity of silicon carbide and tungsten carbide is between 100 and 225 W/m-K, respectively. Therefore, such interface material among diamond particles and metallic matrix imparts a substantial thermal resistance during the transport of the heat energy from the active device through the submount substrate.

The failure in achieving a theoretical thermal conductivity of the composite of diamond particles and metallic matrix can also be due to a mixture of heat-conduction mechanisms. Specifically, the movement of electrons via diffusion dominates the conduction of heat in a metallic matrix. Strong $Sp^3$ carbon-carbon covalent bonds are responsible for the high thermal conductivity in diamond, via phonon dispersion along diamond lattices, even though there are no free electrons. Energy exchange between phonon conduction in the diamond material of a diamond/metal or metallic matrix and an electron diffusion in metal material of the diamond/metal or metallic matrix can fundamentally slow down the overall heat transport from an active device though a submount substrate made of a composite of diamond particles and metallic matrix.

SUMMARY OF THE INVENTION

Disclosed herein is a composite substrate comprising, in an example, a submount substrate comprising an alternating pattern of diamond portions and metal or metallic portions. The diamond portions of the submount substrate can spread heat energy via phonon transport along the lattice of diamond $Sp^3$ carbon-carbon bonds, while the metal or metallic portions transport and spread heat energy via electron movement. This combination allows an active device mounted on the submount to operate either at a lower temperature, or at a higher power, or a combination of the two, which is highly desirable.

In an example, the composite CTE of the submount substrate can be tuned by varying the geometry of the diamond portions and/or the metal portions. In this manner, a CTE difference between the CTE of the active device and the composite CTE of the submount substrate can be controlled to reduce thermal stress on the active device resulting from temperature fluctuations during operation of the active device mounted on the submount substrate when power to the active device is cycled between on and off. This reduced thermal stress can result in the active device having a longer operating life, and/or allowing the active device to operate at a higher power levels.

When an active device or an array of active devices are mounted and aligned directly over the diamond portion(s) of the submount substrate, a temperature rise plateau across the array is reduced over like arrays mounted on a prior art submount substrate, and temperature oscillations across the array are also damped over like arrays mounted to a prior art submount substrate, resulting in reduced thermal stress and corresponding temperature oscillation across the array of active devices.

In an example, submount substrate having a length, width and height that extend in respective X, Y and Z directions of a Cartesian coordinate system, widths (Y direction) of the diamond portions and metal or metallic portions alternate laterally in the X direction; lengths of the diamond portions and metal or metallic portions of the composite substrate extend in the Y direction; and one or more active devices is/are mounted in the Z direction atop of the submount substrate. In an example, where a single row of two or more active devices are mounted atop of the submount substrate, each active device can be mounted over a unique one of the diamond portions.

Another example composite substrate includes a submount substrate comprised of a diamond layer mounted on one side of a metal or metallic layer. One or more active devices can be mounted on the other side of the metal or metallic layer, i.e., a side of the metal or metallic layer opposite the diamond layer.

Various preferred and non-limiting examples or aspects of the present invention will now be described and set forth in the following numbered clauses:

Clause 1: A composite substrate comprises: a set of spaced electrical conductors; means for supporting the spaced electrical conductors; and a set of electrical insulators, wherein between each pair of spaced electrical conductors is positioned one of the electrical insulators in contact with said pair of electrical conductors.

Clause 2: The composite substrate of clause 1 can further include at least one active device positioned over one or both of the following: a portion of one of the electrical insulators; and a portion of one of the electrical conductors.

Clause 3: The composite substrate of clause 1 or 2, wherein the means for supporting the spaced electrical conductors can be positioned between the active device and said one electrical insulator.

Clause 4: The composite substrate of any of clauses 1-3, wherein the active device can be a semiconductor device having at least one P-N junction.

Clause 5: The composite substrate of any of clauses 1-4, wherein a ratio between a Coefficient of Thermal Expansion (CTE) of the composite substrate and a CTE of the active device can be between 0.4 and 2, or between 0.5 and 1.8, or between 0.6 and 1.6, or between 0.7 and 1.4, or between 0.8 and 1.2.

Clause 6: The composite substrate of any of clauses 1-5, wherein each electrical insulator can be comprised of diamond.

Clause 7: The composite substrate of any of clauses 1-6, wherein each electrical conductor can be comprised of a metal or a metal alloy.

Clause 8: The composite substrate of any of clauses 1-7, wherein each electrical conductor can be comprised of a copper-tungsten (Cu—W) alloy.

Clause 9: The composite substrate of any of clauses 1-8, wherein the means for supporting the spaced electrical conductors can include one of the following: a shaft or back to which one end of each electrical conductor is coupled; or a plate to which one side of each electrical conductor is coupled.

Clause 10: The composite substrate of any of clauses 1-9, wherein the spaced electrical conductors and the means for supporting the spaced electrical conductors can be a unitary piece formed of the same material.

Clause 11: The composite substrate of any of clauses 1-10, wherein each electrical insulator can be: directly grown on said pair the electrical conductors in contact with said electrical insulator; or can be bonded to said pair the electrical conductors in contact with said electrical insulator; or can be in direct contact said pair the electrical conductors, e.g., a friction fit.

Clause 12: The composite substrate of any of clauses 1-11, wherein each electrical insulator directly grown on said pair the electrical conductors in contact with said electrical insulator can be grown via chemical vapor deposition (CVD).

Clause 13: The composite substrate of any of clauses 1-12, wherein each electrical insulator bonded to said pair the electrical conductors in contact with said electrical insulation can be bonded via an adhesive.

Clause 14: The composite substrate of any of clauses 1-13 can further include a dielectric material between the active device and one or both of said portion of the one electrical insulator and said portion of the one electrical conductor.

Clause 15: The composite substrate of any of clauses 1-14 can further include on said dielectric at least one conductor configured to convey electrical signals to and/or from contacts of the active device.

Clause 16: A composite substrate comprises: an alternating pattern of diamond portions, pieces or segments and metal or metallic portions, pieces or segments; and means for supporting the alternating pattern of diamond portions, pieces or segments and metallic portions, pieces or segments, wherein each metallic portion, piece or segment has a coefficient of thermal expansion (CTE)<$12\times10^{-6}$ meter/meter-degree Kelvin, <$11\times10^{-6}$ meter/meter-degree Kelvin, <$10\times10^{-6}$ meter/meter-degree Kelvin, or <$9\times10^{-6}$ meter/meter-degree Kelvin.

Clause 17: The composite substrate of clauses 16, wherein the means for supporting the alternating pattern of diamond portions, pieces or segments and metallic portions, pieces or segments includes one of the following: a shaft or back to which one end of each metallic portion is coupled; or a plate to which one side of each metallic portion is coupled.

Clause 18: The composite substrate of clause 16-17 can further include an active device positioned over one or both of the following: a portion of one of the diamond portions, pieces or segments; and a portion of one of the metallic portions, pieces or segments, wherein the active device includes a P-N junction.

Clause 19: The composite substrate of any of clauses 16-18, wherein a ratio between a Coefficient of Thermal Expansion (CTE) of the composite substrate and a CTE of the active device can be between 0.4 and 2; or between 0.5 and 1.8; or between 0.6 and 1.6; or between 0.7 and 1.4; or between 0.8 and 1.2.

Clause 20: The composite substrate of any of clauses 16-19, wherein the alternating pattern of diamond and metallic portions, pieces or segments define a submount and the composite substrate can further include: a dielectric layer between the active device and at least a portion of the submount; and a conductor formed on the dielectric layer, said conductor in electrical continuity with a contact of the active device.

BRIEF DESCRIPTION OF THE DRAWINGS

FIGS. 1A-6 show six different example composite substrates, including active devices mounted on different example submount substrates to form the composite substrates.

DESCRIPTION OF THE INVENTION

Figure 1A:
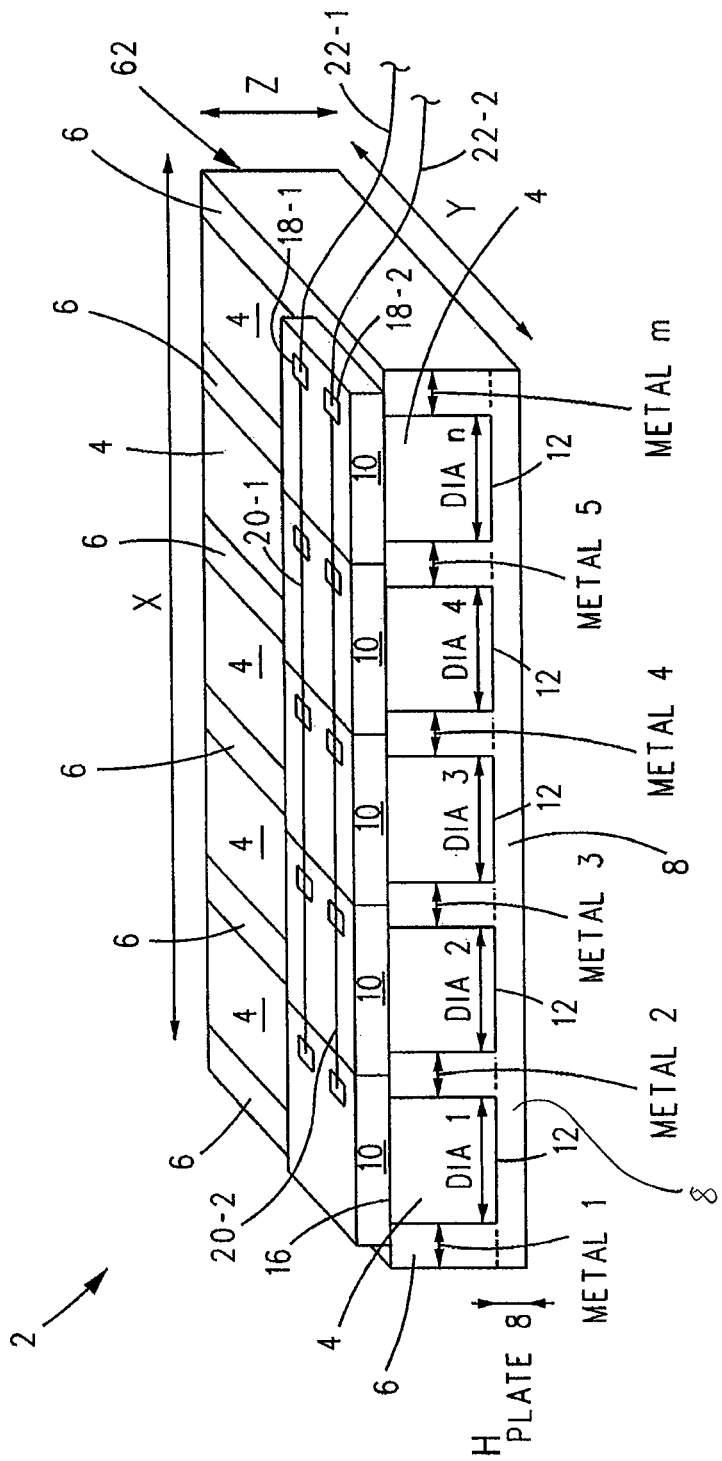

The following examples will be described with reference to the accompanying figures where like reference numbers correspond to like or functionally equivalent elements.

FIGS. 1A-5 illustrate various example composite substrates 2, each of which comprises a submount substrate 62 comprised of an alternating pattern of diamond portions, pieces, or segments 4 and metal or metallic portions, pieces, or segments 6. Hereinafter, references to metal portion(s) 6 and metallic portion(s) 6 are used interchangeably to refer to portion(s) 6 comprised of a single metal or a metal alloy. Composite substrate 2 can further comprise an active device 10, or an array of active devices 10, such as, for example, laser diodes, which can be mounted with different bonding mechanisms (such as, for example, solder, adhesive, etc.), on the top of submount substrate 62. Submount substrate 62 can be any geometric shape. FIGS. 1A-6 illustrate rectangular geometries with dimensions of X, Y, and Z, wherein both the ratio of X to Z and the ratio of Y to Z are ≥1.

Diamond portions 4 may be polycrystalline or monocrystalline diamond. Each diamond portion 4 can be in form of a rectangular strip, a trapezoid strip, an arc-shaped strip, a triangle-shaped strip, or any regular or irregular shape. In an example, each diamond portion 4 is substantially continuous and can be joined to or grown on metallic portions 6 of submount substrate 62, which metallic portions 6 can be of any geometric shape.

Diamond portions 4 can be grown directly onto surfaces of metal portions 6 by a chemical vapor deposition (CVD) process, such as, for example, Hot-Filament Plasma CVD, DC-Jet Plasma CVD, Laser-induced-Plasma CVD, Acetylene-Torch-CVD, Radio-Frequency-Plasma CVD, Flame-Plasma CVD, or microwave plasma-aided CVD (MPCVD). The exposed surface of diamond portions 4 grown on metal portions 6 can be optionally lapped and, further, optionally polished to achieve a desirable surface finish for bonding of active device(s) 10 or other active or passive devices that would benefit by heat removal for their operation.

The surface of submount substrate 62 can be plated or deposited with one or more layers of metals, such as, for example, nickel, silver, gold, platinum, etc., and/or dielectric layers, such as, for example, aluminum nitride, boron nitride, beryllium oxide, alumina, silica, etc.

Metal portions 6 can comprise a chemical element that is capable of forming carbide bonds. Examples of the carbide-forming metals can include, for example, tungsten, molybdenum, titanium, silicon, chromium, niobium, zirconium, tantalum, hafnium, etc. Metal portions 6 can include another element, such as, for example, copper, aluminum, silver, or one of the base metals in the Periodic Table for tuning a Coefficient of Thermal Expansion (CTE) of the metal portions 6 to less than $12\times10^{-6}$ m/m-K and improve the thermal conductivity of the carbide-bond-forming metal.

For achieving cohesive surface bonding between diamond portions 4 and metal portions 6, the surfaces of metal portions 6 can be optionally treated chemically for the purposes of direct seeding of diamond material on metal portions 6. In an example, the chemical treatment can be chemical etching of metal portions 6, for example, etching the surface of a copper-tungsten alloy (forming metal portions 6) for better adhesion of diamond portions 4 to metal portions 6. The chemical used for etching can be an acid, a base, salts, a chelating agent, an oxidizing agent, and/or a reducing agent, along with an optional liquid or a gas medium (such as water or gas). The acid used for etching can be nitric acid, hydrochloric acid, sulfuric acid, phosphoric acid, chloric acid, perchloric acid, chromic acid, etc.

Metal portions 6, either a single metal element or metallic alloy with another element, can have a coefficient of thermal expansion, $\alpha_{Metal}$. Diamond portions 4 can have a coefficient of thermal expansion, $\alpha_{Dia}$, which can be between 1.0 m/m-K and $1.2\times10^{-6}$ m/m-K. There can be m metallic portions 6 and n diamond portions 4. The dimensions, (e.g., widths) of metal portions 6, Metal j, do not have to be the same. The dimension (e.g., widths) of diamond portions 4, Dia i do not have to be the same either. The CTE of the material forming active devices 10 is designated as $\alpha_{Active-Material}$. The relationship between metal portions 6 and diamond portions 4 can be expressed as follows:

$$\sum_{i=1}^{n}(Dia\,i\,\alpha_{Dia})+\sum_{j=1}^{m}(Metal\,j\,\alpha_{Metal})=$$

$$\delta\left\{\sum_{i=1}^{n}(Dia\,i)+\sum_{j=1}^{m}(Metal\,j)\right\}\alpha_{Active\,Material}$$

where, in an example with reference to FIG. 1A:
  Dia i=width (in the X direction) of diamond layer i; and
  Metal j=width (in the X direction) of metal layer j.

The leading coefficient on the right side of this equation, namely δ, is an indication of the level of CTE matching between the CTE of submount substrate 62 and the CTE of active device(s) 10, such as, for example, a laser diode made of GaAs. When the δ parameter is close to 1, the CTE of the submount substrate 62 and the CTE of material forming the active device(s) 10 is closely matched. In order to reduce thermal stress between the submount substrate 6 and the active device(s) 10, the δ parameter can vary, in an example, from 0.4 to 2; in another example from 0.5 to 1.8; in another example from 0.6 to 1.6; in yet another example from 0.7 to 1.4; and in yet another example from 0.8 to 1.2.

In order to have an acceptable level of thermal stress between diamond portions 4 and the metal portions 6, the metal portions 6 (either a single metal or a metal alloy) can, in an example, have a coefficient of thermal expansion (CTE) less than $12\times10^{-6}$ m/m-K; in another example less than $11\times10^{-6}$ m/m-K; in another example less than $10\times10^{-6}$ m/m-K; and in another example less than $9\times10^{-6}$ m/m-K. Therefore, a local mismatch of the CTE of diamond portions 4 and metal portions 6 can be minimized, resulting in reduced local thermal stress between the boundaries of diamond portions 4 and metal or metal portions 6 of submount substrate 62.

In addition to reducing thermal stress resulting from a close CTE match between active device(s) 10 and submount substrate 62, additional advantages of composite substrates 2 in FIGS. 1A-6 include: superior heat-spreading across diamond portions 4 along the Y direction; and superior heat-sinking through diamond portions 4 along the Z direction to, for example, a sub-layer material for ultimate heat removal (such as a heat sink equipped with water-cooling channels). In order to achieve optimal heat-sink performance, the height (Z) of the submount substrate 62 can be as thin as possible and the width (Y) of submount substrate 62 can be as wide as possible, whereupon a ratio of width (Y) to height (Z) can, in an example, be greater than 1 or greater than 2. For practical reason to facilitate the installation of one or more active device(s) 10, a ratio of length (X) of submount substrate 62 to height (Z) of submount substrate 62 can be greater 1 or greater than 2. The ratio of length (X) of submount substrate 62 to width (Y) can, in an example, vary from 0.001 to 1000; in another example, can vary from 0.01 to 100; in another example, can vary from 0.05 to 20; and, in another example, can vary from 0.1 to 10.

In each example submount substrate 62 shown in FIGS. 1A-5, horizontal (X) heat-spreading and vertical (Z) heat-sinking occur concurrently in diamond portions 4 via a phonon transport mechanism along diamond $Sp^3$ crystal lattices. Phonon transport is the fastest known heat transport mechanism. Though not as efficient as diamond portions 6, metal portions 6 carry out horizontal (X) heat-spreading and vertical (Z) heat-sinking via thermal conductivity of the metal portions 6.

Each active device 10 can be mounted and aligned directly over a portion of one of diamond portions 4, or over a portion of one of the metal portions 6, or over mixed portions of diamond portions 4 and metal portions 6. In an example, an active device 10 can be mounted over or directly atop of an area of submount substrate 62 having one or more diamond portions 4, one or more metal portions 6, or a mix of both. The width of this active device 10 can be greater than, equal to, or smaller than a width of a diamond portion 4. The diamond portion 4 can have a width narrower than the width of an active area of the active device 10, which facilitates damping a temperature oscillation.

Each active device 10 generates heat in operation. The space between adjacent pairs of active devices 10 typically does not produce heat. Therefore, during operation of an active device 10 or an array of active devices 10, the heat generated in the active area (for example, the P-N junction area of the emitter of a laser diode, a light-emitting diode, etc.) of each active device 10 forms a temperature profile across the active device 10 or the array of active devices 10, while area(s) besides or between active areas, such as between two diode emitters, has a temperature minima, though the temperature minima is still higher than the temperature of an idling active device 10 or array of idling active devices 10. Such uneven heating can lead to a temperature oscillation on an elevated temperature plateau. This temperature oscillation can create an oscillated thermal stress across each active device 10 due to oscillated thermal expansion. For example, a tensile stress can be created on an active area of an active device 10 if the CTE of submount substrate 62 is greater than the CTE of the active material of the active device 10, particularly for highly mismatched CTEs of an active device 10 and submount substrate 62. A temperature plateau also creates thermal stress between active device(s) 10 and the submount substrate 62 if there is a CTE mismatch between them. Therefore, when an active device 10 (such as a laser diode emitter) is mounted and aligned over (atop) of a diamond portion 4 of submount substrate 62, heat that is generated by active device 10 during operation sinks quickly into diamond portion 4 to be removed along the Z direction shown in FIGS. 1A-5. Heat removed from active device 10 also quickly spread horizontally in diamond portion 4 in the Y direction shown in FIGS. 1A-5 and then sinks; in the Z direction, into the lower part of the diamond portion 4 for removal, which effectively results in more area (under diamond) available for heat removal. So, the overall temperature rise during operation of an active device 10 is lower (attaining a lower temperature plateau), which is highly desirable for minimizing thermal stress, allowing active device 10 work more efficiently, have a longer life span, and/or operate at a higher power level. At the same time, temperature oscillation on the temperature plateau is substantially damped due to fact that produced heat is removed faster in the diamond portion 4 than in the metal portion 6, which is desirable for achieving temperature oscillation damping, therefore, having a thermal stress oscillation damped across an active device 10 or an array of active devices 10.

In an example, CTE matching between active device(s) 10 and submount substrate 62 at a global level, minimizes or avoids a, so-called, "Smile" problem during mounting of active device(s) 10 to submount substrate 62 and or during operation when active device(s) 10 experience temperature fluctuations. For example, compression stress within an individual active device 10 while mounted on the top of a diamond portion 14 may not be completely eliminated but such compression stress can be minimal (due to a smaller temperature rise, or a smaller temperature plateau) and can be limited to a local area, allowing an array of active devices 10 to have a long life span. For comparison, if an array of active devices 10 are installed on a strip of a diamond or on a strip of copper, aluminum, silver, or their corresponding metal alloys, the compression or tensile stress applied to the active devices 10 accumulates linearly, which can lead to delamination between the array of the active devices 10 and the strip.

In an example, submount substrate 62 can have mounted thereon a laser-diode bar that has, in an example, 10 emitters and GaAs as the active material for these laser diodes. In an example, the laser-diode bar can be a one-dimensional array of active devices 10, for example, laser diodes that are mounted horizontally on the top of and along the edge of submount substrate 62 (see, FIGS. 1A-5) and emit light that is parallel to the top surface of the submount substrate, i.e., along Y direction in FIGS. 1A-5. The width (X) of an individual laser-diode emitter can be 100 microns. The pitch for the repeated pattern of the array can be 200 microns. A simple design of submount substrate 62 can include an alternating pattern of 10 diamond portions 4 and 11 metal portions 6 (for example, a Cu—W alloy that comprises 20% copper and 80% tungsten, having a CTE of about 7.70 ppm/K) that comprises both ends of submount substrate 62. Each diamond portion 4 can be positioned between a pair of metal portions 6 below the center of one of the active devices 10 and can be, in an example, 60 microns in width (X direction). Each metal portion 6 can be 140 microns in width (X direction), located mainly between active devices 10. For each 200 micron pitch, the CTE of the submount substrate 62 is calculated (using the above equation) to be about 5.75 ppm/K, a δ parameter of 0.991; a very close match to the CTE of GaAs (5.8 ppm/K). Increasing the width of diamond portions 4 to 70 microns and reducing the width of the Cu—W metal portions to 130 micron, would lead to submount substrate 62 having a calculated CTE of about 5.425 ppm/K (calculated using the above equation), a δ parameter of 0.935. Reducing the width of the diamond portions 4 to 40 microns and increasing the width of the Cu—W metal portions 6 to 160 microns would lead to submount substrate 62 having a calculated CTE of about 6.4 ppm/K, a δ parameter of 1.10. A global CTE match between the material(s) of active device(s) 10 and the materials of submount substrate 62 can help avoid the "Smile" problem.

With the submount substrate 62 described herein, the CTE of active device(s) 10 and the global CTE of submount substrate 62 can be closely matched. Therefore, the "Smile" problem can be minimized with a δ value in the range between 0.4 and 2.0, or avoided with the δ value equal to 1. Additionally, the temperature rise plateau and temperature oscillation can be minimized by the alternating pattern of diamond portion(s) 4 and metal portion(s) 6, where each diamond portion 4 facilitates heat sinking and spreading faster than a metal portion 6, especially when the active device 10 (such as laser diode) is directly mounted directly atop of (centered over) a diamond portion 4. The width of each diamond portion 4 can also be tuned to make the temperature plateau as flat as possible. One way to achieve this is by having a narrower diamond portion 4 along the edge (adjacent metal portions 6) and having a wider diamond portion 4 in the center (intermediate adjacent metal portions 6), which can slow down cooling in the edge of diamond portion 4, as compared to at the center of diamond portion 4.

In another example, submount substrate 62 can be a substrate for a VCSEL (Vertical-Cavity Surface-Emitting Laser) array that has, for example, 225 emitters (a 15×15 array of active devices 10) and GaAs as the active material for these laser diodes. In this example, the VCSEL array is a two-dimensional array of laser diodes that are mounted on the top surface of the submount substrate 62 and emit light that is perpendicular to the top surface of the submount substrate 6, i.e., along Z direction shown in FIGS. 1A-6. In this example, the VCSELs are arranged into 15 rows (X direction) and 15 columns (Y direction), with the 15 VCSELs in each column positioned over (e.g., centered atop of) a single diamond portion 4. Assume that each laser diode has an emitting area of 100 microns in diameter. Also assume that the pitch of the repeated pattern of these emitters is about 250 microns. A simple example design of submount substrate 62 can include an alternating pattern of 15 diamond portions 4 and 16 metal portions 6 (for example, a Cu—W alloy that comprises 20% copper and 80% tungsten, having a CTE of about $7.70 \times 10^{-6}$ m/m-K), with metallic portions 6 at both ends of submount substrate 62. Diamond portions 4 can be 100 microns in width (X direction in FIG. 1A-5) and the Cu—W portions can be 150 microns in width (X direction in FIG. 1A-5). For each such pitch, the global CTE of submount substrate 62 can be calculated (using the above equation) to be about 5.10 ppm/K, a δ parameter of 0.88, a close match to the CTE of GaAs (5.8 ppm/K). Reducing the width diamond portions 4 to 75 microns while increasing the width of the Cu—W portions to 175 microns would lead to submount substrate 62 substrate having a global CTE of about 5.75 ppm/K, a δ parameter of 0.999. Reducing the width of diamond portions 4 to 40 microns, while increasing the width of the Cu—W portions to 210 microns would lead to a submount substrate 62 having a global CTE of about 6.66 ppm/K, a δ parameter of 1.15.

Achieving CTE match between the CTE of the active device 10 material (such as VCSEL's made of GaAs) and the example submount substrate(s) 62 described herein can help avoid physical deformation of active device(s) 10. Mounting of active device(s) 10 typically involves soldering active device(s) 10 to a substrate, such as submount substrate 62, at an elevated temperature, for example, 200 to 400° C. With submount substrate 62, the CTE of active device(s) 10 and the global CTE of submount substrate 62 can be closely matched whereupon physical shape deformation of the active device(s) 10 can be reduced, with the δ parameter in a range between 0.4 and 2.0, or avoided when the δ parameter is equal to 1.

Additionally, a 3D temperature rise plateau and temperature oscillation that is on the temperature plateau can be minimized by the alternating pattern of diamond portion(s) 4 and metal portion(s) 6, where each diamond portion 4 allows heat to sink and spread faster than a metal portion 6, especially if each active device 10 (such as laser diode) is, for example, mounted directly atop of (centered over) a diamond portion 4. The width of each diamond portion 4 can also be tuned to make the temperature plateau as flat as possible. One way to achieve this is by having a narrower diamond portion 4 in the edge by adjacent metal portions 6 and having a wider diamond portion 4 in the center of the diamond portion, which intentionally slows the cooling down in the edge, as compared to the cooling at the center.

In an example, where submount substrate 62 has 15 diamond portions 4 (X direction) and 16 metal portions 6 (Y direction) for a 15×15 2D VCSEL array, each active device (laser diode) in the VCSEL array can be mounted directly above (centered over) one of the diamond portions 4, with 15 VCSEL's mounted over a single diamond portion 4. The heat generated by these laser diodes in operation sinks or spreads quickly via the diamond portions 4 for removal by an underneath layer (not shown)—sometimes equipped with water cooling channels) which allows the VCSELs to perform either at a lower temperature, or at a higher power (at the same temperature), or both.

Details of various example composite substrates 2 will now be described with reference to FIGS. 1A-6.

With reference to FIGS. 1A-1D, an example composite substrate 2 includes an alternating pattern of diamond portions, pieces, or segments 4 and metal or metallic portions, pieces, or segments 6. In an example, the metal or metallic portions 6 can be supported by a metal or metallic plate 8 to which one side of each metal portion 6 is coupled. Herein, each reference to "metal" or "metallic" is intended to include a single metal or a metal alloy comprised of two or more metals.

In this example, metal plate 8 comprises a means for supporting the alternating patterns of diamond portions 4 and metal portions 6. In this example, metal plate 8 and metal portion 6 are part of a unitary piece made of the same material that includes channels 12 between adjacent pairs of metal portions 6. However, the description herein of metal plate 8 and metal portion 6 being a unitary piece is not to be construed as limiting since it is envisioned that metal plate 8 and metal portion 6 can be separate elements.

In this example, metal portions 6 comprise a set of spaced electrical conductors; metal plate 8 comprises a means for supporting the spaced electrical conductors; and diamond portions 4 comprise a set of electrical insulators, wherein between each pair of electrical conductors 6 is position one of the electrical insulators 4 in contact with said pair of electrical conductors 6.

The example composite substrate 2 shown in FIG. 1A has a length X a width Y and a height Z. Diamond portions 4, metal portions 6 and metal plate 8 comprise a submount substrate 62 to which one or more active devices 10 can be mounted to form the completed composite substrate 2 shown in FIG. 1A.

Each active device 10 can be positioned over part of one of the diamond portions 4, part of one or more metal portions 6, or both. For example, each active device 10 can have a width 12 (in the X direction) that falls within the width (in the X direction) of the underlying diamond portion 4. In another example, each active device 10 can have a width such that the active device 10 is positioned over part of one of the diamond portions 4 and parts of one or more metal portions 6, as shown in FIG. 1A. More generally, each active device 10 can be positioned over one or both of the following: a part of a diamond portion 4 that is not in contact with one of the metal portion 6, a part of one of a metal portion 6 not in contact with at least one of the diamond portions 6, or part(s) of both one or more diamond portions 4 and part(s) of one or more metal portion 6. In the example composite substrate shown in FIG. 1A, each active device 10 is positioned over part of one of the diamond portions 4 and over parts of adjacent metal portion 6. However, the particular manner in which each active device 10 in FIG. 1A is positioned over the combination of a diamond portion 4 and metal portions 6 is not to be construed in a limiting sense.

In an example, each active device 10 can be a semiconductor device that can include a P-N junction. Each active device 10 can also generate heat in operation. The description herein of each active device 10 including a P-N junction is not to be construed in a limiting sense since it is envisioned that each active device 10 can also or alternatively include one or more passive elements that generate heat in operation.

In an example, each diamond portion 4 can be pre-formed and inserted into one of the channels 12 defined between an adjacent pair of metal portions 6 and the underlying portion of the metal plate 8. In another example, all of the diamond portions 4 can be grown directly in each channel 12, on the pair of metal portion 6 and the underlying portion of the metal plate 8 defining said channel 12, in a manner known in the art. In an example, all of the diamond portions 4 can be simultaneously deposited in the channels 12 via chemical vapor deposition (CVD).

In an example, each active device 10 can be a side emitting laser diode which emits LED light in the Y direction shown in FIG. 1A, or a vertical-cavity surface-emitting laser (VCSEL) that emits laser light in the Z direction shown in FIG. 1A.

In an example where diamond portions 4 are formed as separate pieces that are inserted into channels 12, an adhesive 14 (FIG. 1B) can be utilized to bond each diamond portion 4 to the metal portions 6 and underlying portion of the metal plate 8 defining said channel 12. In another example, each diamond portion 4 can be friction fit into a corresponding channel 12.

In an example, each active device 10 can be bonded to a top surface of the submount substrate 62 comprised of diamond portions 4 and metal portions 6 via a layer 16, such as, for example, an adhesive layer, e.g., a conductive adhesive. Where layer 16 is used exclusively as an adhesive layer, electrical signals can be provided to each active device 10 via contacts 18-1 and 18-2 on top of said active device 10. In an example where a number of active devices 10 are provided as a single strip (FIG. 1A), contacts 18-1 and 18-2 on each device 10 can be connected to common conductive traces 20-1 and 20-2, respectively, which can be utilized to provide electrical signals from an external source (not shown) via conductors 22-1 and 22-2 from the external source to each active device 10 via a single set of contacts 18-1-18-2, as shown in FIG. 1A.

In another example with reference to FIGS. 1C and 1D, instead of connecting conductors 22-1 and 22-2 to contacts 18-1 and 18-2 and traces 20-1 and 20-2 on the exposed (top) surfaces of active devices 10 mounted on submount substrate 62 as shown in FIG. 1A, conductors 22-1 and 22-2 can be coupled to contacts 24-1 and 24-2 of layer 16 formed on submount substrate 62. In this example, layer 16 can be comprised of insulating material on which active devices 10 are mounted. Conductive traces 26-1 and 26-2 can electrically couple contacts 24-1 and 24-2 to contacts 28-1 and 28-2, respectively. In turn, contacts 28-1 and 28-2 can be coupled to contacts 30-1 and 30-2 on a surface of a single active device 10 or at least one active device 10 of an active device array in a manner known in the art, e.g., a ball grid array for flip-chip mounting. Traces 32-1 and 32-2 can couple contacts 30-1 and 30-2 to like contacts on other active devices 10 of the active device array shown in FIG. 1D.

The particular manner described herein for coupling external electrical signals to each active device 10 is not to be construed in a limiting sense since it is envisioned that any suitable and/or desirable means for coupling external signals to one or more active devices 10 positioned on submount substrate 62 shown in FIG. 1A can be used.

Figure 2:
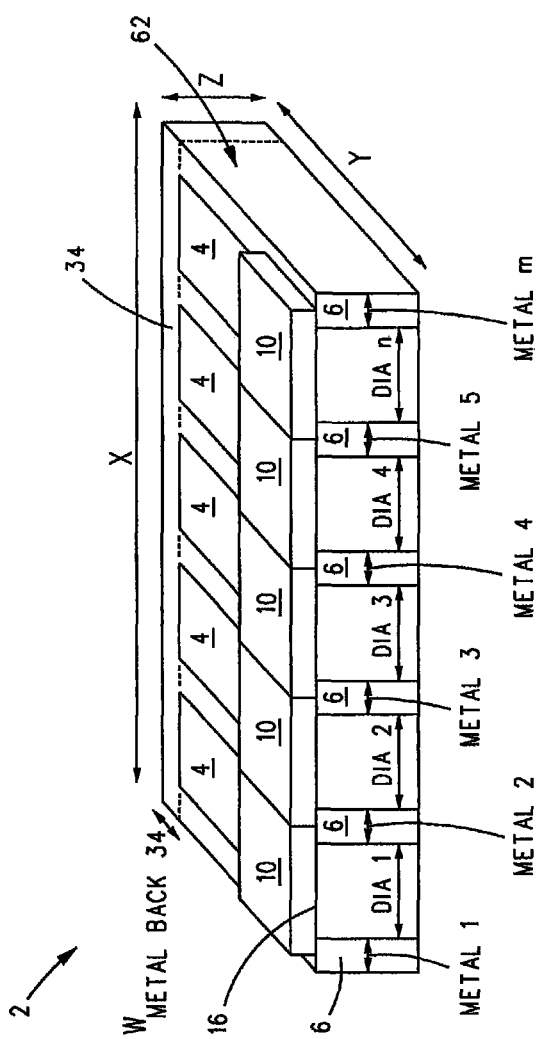

With reference to FIG. 2 and with continuing reference to FIGS. 1A-1D, another example composite substrate 2 is similar to example composite substrate 2 shown in FIGS. 1A-1D with the following exceptions. In the example composite substrate 2 shown in FIG. 2, metal plate 8 (in FIGS. 1A-1B) is omitted and replaced by a metal back or shaft 34

(in FIG. 2). In an example, metal back 34 and metal portions 6 can be a unitary piece formed of the same material. However, this is not to be construed in a limiting sense since it is envisioned that metal back 34 and metal portion 6 can be separate elements and can be formed of the same or different materials. In this example, diamond portions 4, metal portions 6, and metal back 34 comprise a submount substrate 62, and the addition of active devices 10 to this submount substrate 62 comprises the composite substrate 2 of this example.

In this example, metal portions 6 comprise a set of spaced electrical conductors; metal back 34 comprises a means for supporting the spaced electrical conductors; and diamond portions 4 comprise a set of electrical insulators.

Except for the omission of metal plate 8 (FIG. 1A) and the addition of metal back 34 (FIG. 2), the example composite substrate 2 shown in FIG. 2 is the same as the example composite substrate 2 shown in FIGS. 1A-1D. Accordingly, additional details of the example composite substrate 2 shown in FIG. 2 will not be described herein to avoid unnecessary redundancy.

Moreover, details regarding the optional ways of mounting one or more active devices 10 to any example submount substrate 62 described herein, and the optional ways of coupling conductors 22-1 and 22-2 to contacts 18-1, 18-2 or 30-1, 30-2 of the one or more active devices 10 will not be illustrated in FIG. 2 et seq. or described hereinafter to avoid unnecessary redundancy.

Figure 3:
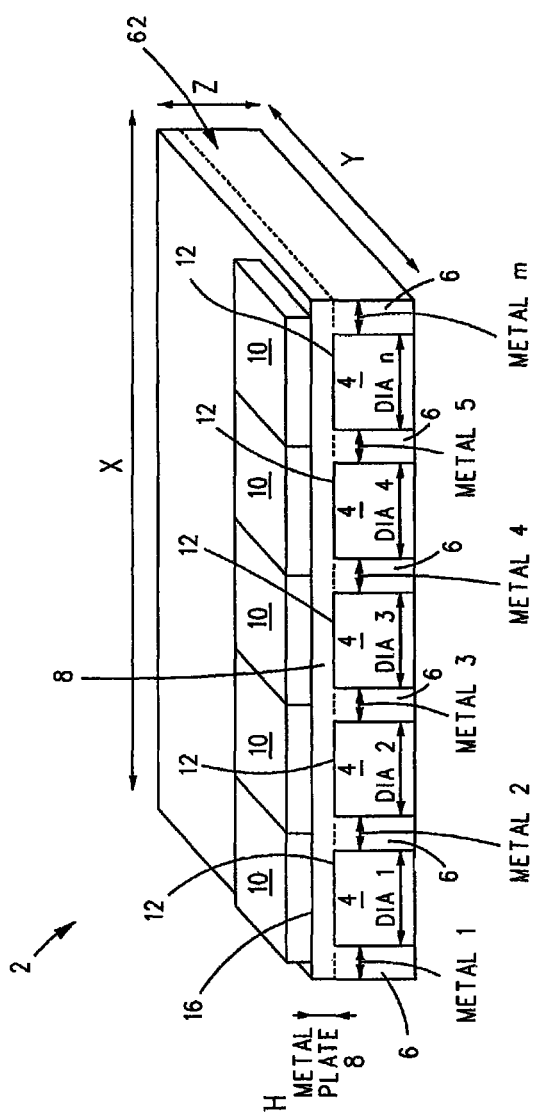

With reference to FIG. 3 and with continuing reference to FIGS. 1A-1D, another example composite substrate 2 shown in FIG. 3 is similar to the example composite substrate 2 shown in FIGS. 1A-1D with the following exceptions. In the example composite substrate 2 shown in FIG. 3, metal plate 8 is positioned atop of diamond portions 4 instead of below diamond portions 4 in FIG. 1A, and the one or more active devices 10 are mounted on the top surface (as seen in FIG. 3) of metal plate 8 via layer 16. In this example, diamond portions 4, metal portions 6, and metal plate 8 comprise a submount substrate 62. In this example, metal portions 6 comprise a set of spaced electrical conductors; metal plate comprises a means for supporting the spaced electrical conductors; and diamond portions 4 comprise a set of electrical insulators. Other than these changes, the composite substrates 2 shown in FIGS. 1A and 3 are the same.

Figure 4:
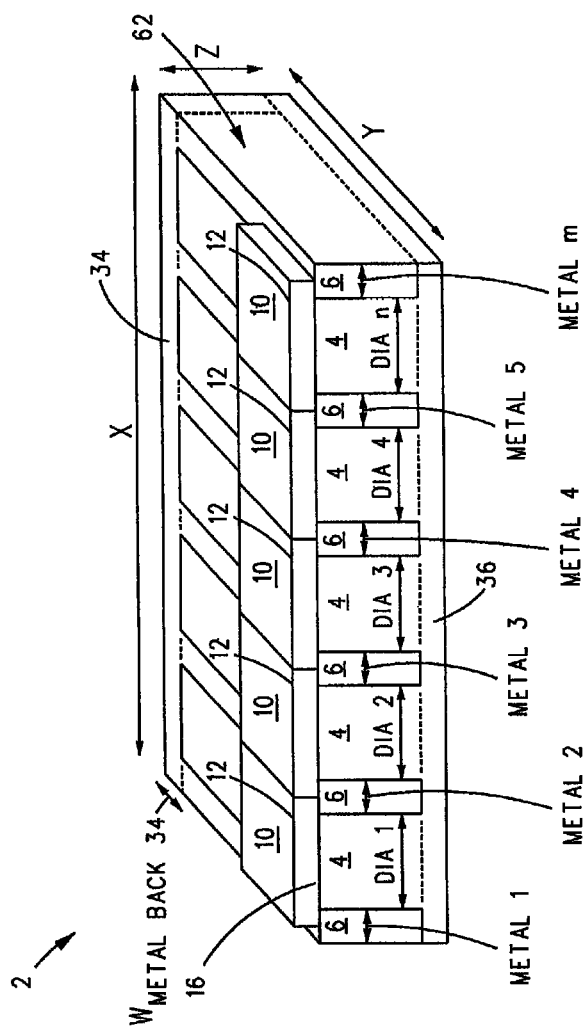

With reference to FIG. 4 and with continuing reference to FIG. 2, the example composite substrate 2 shown in FIG. 4 is similar to the example composite substrate 2 shown in FIG. 2 with the following exception. The composite substrate 2 shown in FIG. 4 includes a diamond plate 36 that is not part of the composite substrate 2 shown in FIG. 2. Diamond plate 36 and diamond portions 4 can be a unitary piece. However, this is not to be construed in a limiting sense. In an example, diamond portions 4 and diamond plate 36 can be formed as a unitary piece that is prefabricated and is mated with metal portions 6 and metal back 34 also fabricated as a unitary piece. In another example, metal portions 6 and metal back 34 are fabricated as a unitary piece and diamond portions 4 are grown (e.g., via CVD) by the deposition of diamond between adjacent pairs of metal portion 6 until the spaces between adjacent metal portion 6 are filled with diamond whereupon the growth of diamond plate 36 occurs by the continued deposition of diamond. It is to be appreciated that during the growth of diamond portions 4 and diamond plate 36, diamond material is deposited via CVD from a side of the unitary piece comprising metal back 34 and metal portions 6 opposite where the one or more active devices 10 are to be mounted.

Thereafter, once diamond portions 4 and diamond plate 36 have been deposited, the submount substrate 62 comprised, in this example, of diamond portions 4, diamond plate 36, metal portions 6, and metal back 34, can be inverted and the one or more active devices 10 can be mounted on the side of the submount substrate 62 opposite diamond plate 36 to form the completed composite substrate 2 shown in FIG. 4.

In this example, metal portions 6 comprise a set of spaced electrical conductors; metal back 34 comprises a means for supporting the spaced electrical conductors; and diamond portions 4 comprise a set of electrical insulators. Other than the addition of diamond plate 36 in FIG. 4, the composite substrates 2 shown in FIGS. 2 and 4 are the same. Diamond plate also comprises an electrical insulator.

Figure 5:
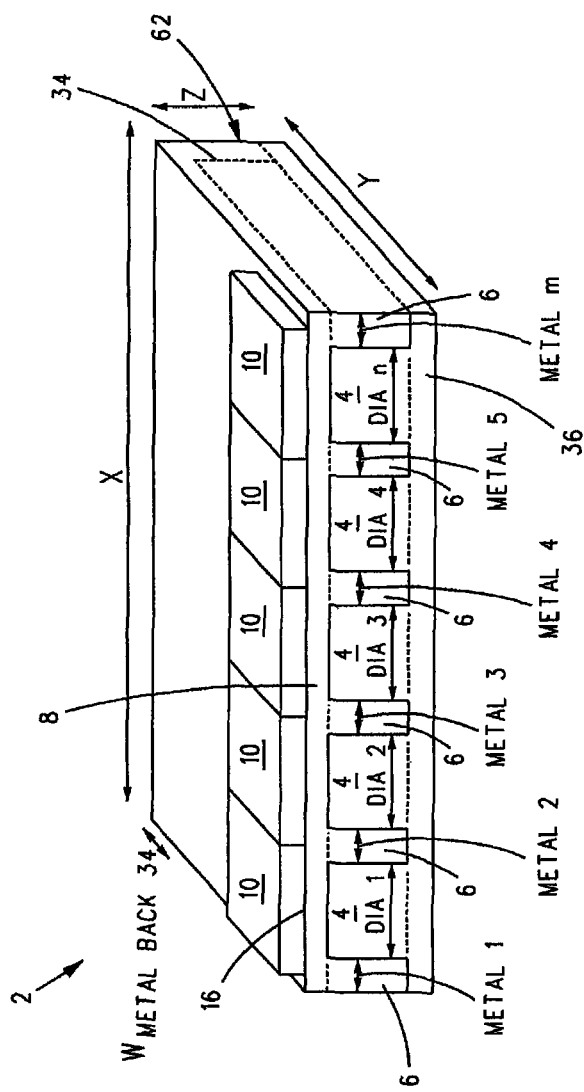

With reference to FIG. 5, another example composite substrate 2 is similar to the example composite substrate 2 shown in FIG. 4 with the following exception. The example composite substrate 2 shown in FIG. 5 includes a metal plate 8, like metal plate 8 shown in FIG. 3, between active devices 10 and diamond portions 4, metal portions 6, and metal back 34. Diamond plate 36 in the example composite substrate 2 shown in FIG. 5 is grown in the same manner as diamond plate 36 of the example composite substrate 2 shown in FIG. 4.

In this example, diamond portions 4, metal portions 6, metal back 34, diamond plate 36, and metal plate 8 comprise a submount substrate 62 to which active device 10 can be mounted to form a composite substrate 2. In this example, metal portion 6 comprise a set of spaced electrical conductors; metal plate 8 and metal back 34 comprise means for supporting the spaced electrical conductors; and diamond portions 4 comprise a set of electrical insulators. Moreover, diamond plate 36 also comprises an electrical insulator.

In each of the composite substrates 2 shown in FIGS. 1A-5, each diamond portion 4 can be grown between adjacent pairs of metal portion 6 by any suitable and/or desirable process, e.g., CVD. If desired, once diamond portions 6 have been grown, diamond growth can continue to form diamond plate 36 (FIGS. 4 and 5). Alternatively, diamond portions 4 and, where applicable, diamond plate 36, can be pre-formed, as separate or unitary pieces and each diamond portion 4 can be inserted and secured between a pair of metal portion 6 via a suitable adhesive 14 (shown in FIG. 1B) or via a friction fit.

Figure 6:
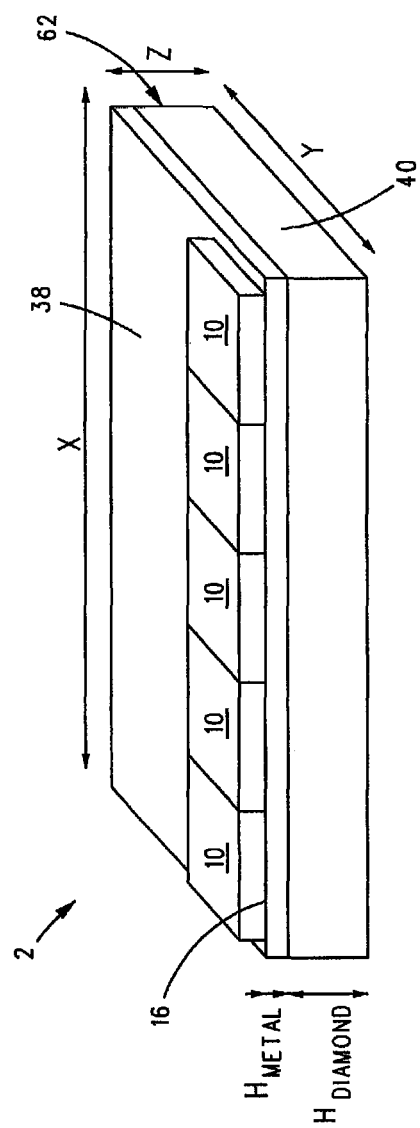

With reference to FIG. 6, another example composite substrate 2 includes one or more active devices 10 positioned atop of a metal plate or layer 38 which, in-turn, is disposed atop of a diamond plate or layer 40. A layer 16, like layer 16 described above, can be used as an interface between the one or more active devices 10 and metal plate or layer 38. In an example, layer 16 can be an adhesive layer. In another example, layer 16 can be a dielectric layer to which the one or more active devices 10 are secured and which can include contacts and/or traces for coupling contacts of said active devices 10 to sources of external electrical signals in the manner described in connection with FIGS. 1A-1D. In this example, diamond plate 40 and metal plate 38 comprise a submount substrate 62 to which active devices 10 can be mounted to form a composite substrate 2. In this example, diamond plate 40 can be pre-formed and coupled (adhered) to metal plate 38 or can be grown on metal plate 38 in any suitable or desirable manner, e.g., CVD.

Figure 7:
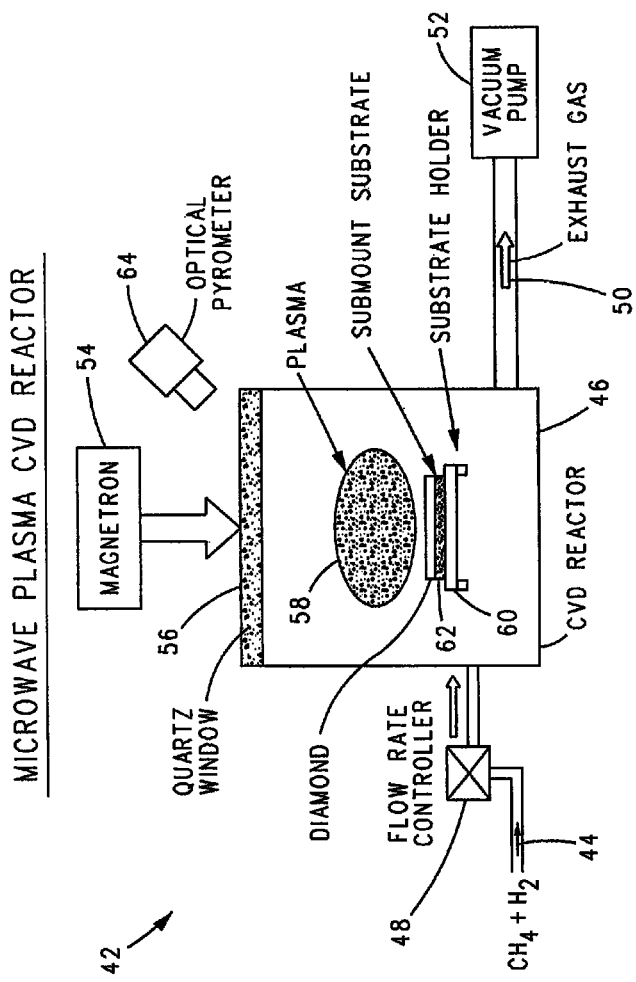
FIG. 7 is a schematic drawing of an example microwave plasma chemical vapor deposition (MPCVD) system that can be used for depositing diamond film on one or more of the example submount substrates shown in FIGS. 1A-6.

With reference to FIG. 7, an example microwave plasma CVD system 42 is shown that can be used to MPCVD grow diamond (4, 36, and/or 40) of each embodiment submount substrate 62 shown FIGS. 1A-6. In use of CVD system 42, a mixture of reactive gases 44, such as, in an example, hydrogen and methane, can be flowed into a microwave plasma CVD reactor 46 and the flow rates of the reactive gases 44 can be controlled by a mass flow controller 48. Exhausted gas 50 flows out of CVD reactor 46, typically to a vacuum pump 52. Microwave energy can be generated by a magnetron 54 and guided to CVD reactor 46 through a quartz window 56. Inside CVD reactor 46, the microwave energy is converted into a plasma 58 which radicalizes the hydrogen molecules of gases 44 into hydrogen free radicals, as well as methane molecules of gases 44 into methyl free radicals, methylene free radicals, methyne free radicals, and secondary or tertiary free radicals that contain two or more carbon atoms. At the bottom of CVD reactor 46 there sits a substrate holder or support 60 that can support a metal substrate for CVD growth of diamond 4 thereon. In an example, this metal substrate can include metal portions 6 and one or both of metal plate 8 and/or metal back 34. In another example, this metal substrate can include metal plate 38.

While plasma 58 is on, the radicalized free radicals that contain carbon atoms bombard the surfaces of the metal substrate which leads to carbon fixation and the formation of diamond on the metal substrate to form submount substrate 62 to which active devices 10 can be mounted as discussed above to form a completed composite substrate 2.

An optional optical pyrometer 64 can be utilized to monitor the temperature of the diamond growing on the metal substrate during diamond deposition. The growth of diamond by microwave plasma CVD utilizing CVD system 42 is well known in the art and will not be described further herein.

Example 1: PCVD Diamond Growth on Trenched Copper-Tungsten

A piece of metallic tungsten of 140 mm in diameter was used as substrate holder 60 in the CVD reactor 46. A piece of copper-tungsten alloy (nominally 20% copper and 80% tungsten), with X×Y×Z dimensions of 8 mm×6 mm×0.4 mm, was placed on the top of substrate holder 60. Prior to placement on substrate holder 60, the surface of this piece of Cu—W alloy was plated with a layer of nickel and a layer of gold and five trenches or channels 12 of 100 microns in depth (Z direction) and 500 microns in width (X direction) were machined along the Y direction of 6 mm. Before placing into CVD reactor 46 for diamond growth, this piece of Cu—W alloy was etched with nitric acid for 30 minutes, followed by flushing with DI water and ultrasonic cleaning with ethanol. With this piece of Cu—W alloy on the top of the substrate holder 60 inside the CVD reactor 46, a mixture of 1850 mL/min hydrogen and 13.7 mL/min methane was flowed into CVD reactor 46. After initiating the plasma, microwave power and the pressure inside CVD reactor 46 were tuned so that the plasma 58 size covered the entire surface of substrate holder 60. After 66 hours of diamond growth on the trenched piece of Cu—W alloy, thereby forming an example submount substrate 62, the reaction was stopped.

In this growth example, diamond was observed to be successfully deposited onto the surface of the Cu—W alloy. More specifically, diamond was observed to have been deposited conformingly into the trenches or channels 12 and onto the top surface of the trenched Cu—W alloy piece between adjacent channels 12. The diamond grains appeared larger in the trenches than on the top surface of the trenched Cu—W alloy piece. The thickness of diamond in the trenches or channels 12 was observed to be 125 microns and the thickness of diamond on the top surface of the trenched Cu—W alloy piece between adjacent channels 12 was observed to be about 100 microns.

The top surface of the 100 micron thick diamond portion of this example submount substrate 62 can be optionally lapped and optionally polished to produce an example submount substrate 62 similar to the submount substrate 62 shown in FIG. 1A. The metal or metallic plate portion of this example submount substrate 62 can also or alternatively be optionally lapped and optionally polished to a desired extent.

Example 2: PCVD Diamond Growth on Plain Copper-Tungsten

A piece of metallic tungsten of 140 mm in diameter was used as substrate holder 60 in CVD reactor 46. A piece of CU—W alloy (nominally 20% copper and 80% tungsten) with X×Y×Z dimensions of 8 mm×6 mm×0.4 mm, was placed on the top of substrate holder 60. The top surface of this piece of CU—W alloy was plain, i.e., was not plated with nickel and/or gold, and no trench was machined in this piece of CU—W alloy. Before placing into CVD reactor 46 for diamond growth, this piece of CU—W alloy was etched with nitric acid for about 30 minutes, followed by flushing with DI water and ultrasonic cleaning with ethanol. With this piece of Cu—W alloy on the top of the substrate holder 60 inside CVD reactor 46, a mixture of 2800 mL/min hydrogen and 20.72 mL/min methane was flowed into CVD reactor 46. After initiating the plasma, microwave power and the pressure inside CVD reactor 46 were tuned so that the plasma 58 size covered the entire surface of substrate holder 60. After 43 hours of diamond growth, the reaction was stopped and diamond was observed to have been successfully deposited on to the surface of this piece of CU—W alloy. An SEM image of the as-grown diamond showed diamond crystals with morphology of square top, which can be of a [100] orientation, and a diamond thickness of 200 microns.

The examples have been described with reference to the accompanying figures. Modifications and alterations will occur to others upon reading and understanding the foregoing examples. Accordingly, the foregoing examples are not to be construed as limiting the disclosure.

The invention claimed is:

1. A composite substrate comprising:
    a set of spaced electrical conductors;
    means for supporting the spaced electrical conductors; and
    a set of electrical insulators, wherein between each pair of spaced electrical conductors is positioned one of the electrical insulators in contact with said pair of electrical conductors, wherein:
    each electrical insulator positioned between one pair of spaced electrical conductors has the form of a strip with at least one lateral end exposed, and
    a planar surface of the composite substrate is defined by the set of electrical insulators positioned between the set of spaced electrical conductors.

2. The composite substrate of claim 1, further including at least one active device positioned over one or both of the following:
    a portion of one of the electrical insulators that is not in contact with one of the spaced electrical conductors; and a portion of one of the electrical conductors that is not in contact with at least one of the electrical insulators.

3. The composite substrate of claim 2, wherein the means for supporting the spaced electrical conductors is positioned between the active device and said one electrical insulator.

4. The composite substrate of claim 2, wherein the active device is a semiconductor device having at least one P-N junction.

5. The composite substrate of claim 2, wherein a ratio between a Coefficient of Thermal Expansion (CTE) of the composite substrate and a CTE of the active device is between 0.4 and 2, or between 0.5 and 1.8, or between 0.6 and 1.6, or between 0.7 and 1.4, or between 0.8 and 1.2.

6. The composite substrate of claim 2, further including a dielectric material between the active device and one or both of said portion of the one electrical insulator and said portion of the one electrical conductor.

7. The composite substrate of claim 6, further including on said dielectric at least one conductor configured to convey electrical signals to and/or from contacts of the active device.

8. The composite substrate of claim 1, wherein each electrical insulator is comprised of diamond.

9. The composite substrate of claim 1, wherein each electrical conductor is comprised of a metal or a metal alloy.

10. The composite substrate of claim 9, wherein each electrical conductor is comprised of a copper-tungsten (Cu—W) alloy.

11. The composite substrate of claim 1, wherein the means for supporting the spaced electrical conductors includes one of the following:
  a shaft or back to which one end of each electrical conductor is coupled; or
  a plate to which one side of each electrical conductor is coupled.

12. The composite substrate of claim 11, wherein the spaced electrical conductors and the means for supporting the spaced electrical conductors are a unitary piece formed of the same material.

13. The composite substrate of claim 1, wherein each electrical insulator is directly grown on said pair the electrical conductors in contact with said electrical insulator; or is bonded to said pair the electrical conductors in contact with said electrical insulator; or is in direct contact said pair the electrical conductors.

14. The composite substrate of claim 13, wherein each electrical insulator directly grown on said pair the electrical conductors in contact with said electrical insulator is grown via chemical vapor deposition (CVD).

15. The composite substrate of claim 13, wherein each electrical insulator bonded to said pair the electrical conductors in contact with said electrical insulation is bonded via an adhesive.

16. The composite substrate of claim 1, wherein each electrical insulator in the form of a strip has a length greater a width of the electrical insulator, and the length greater that a height of the electrical insulator.

17. A composite substrate comprising an alternating pattern of diamond strips and metal or metallic strips, wherein each metal or metallic strip has a coefficient of thermal expansion (CTE)$<12\times10^{-6}$ meter/meter-degree Kelvin, $<11\times10^{-6}$ meter/meter-degree Kelvin, $<10\times10^{-6}$ meter/meter-degree Kelvin, or $<9\times10^{-6}$ meter/meter-degree Kelvin, wherein each diamond strip has at least one exposed lateral end, and a planar surface of the composite substrate is defined by the alternating pattern of diamond strips and metal or metallic strips.

18. The composite substrate of claim 17, further comprising means for supporting the alternating pattern of diamond strips and metal or metallic strips including one of the following:
  a shaft or back to which one end of each metal or metallic strip is coupled; or
  a plate to which one side of each metal or metallic strip is coupled.

19. The composite substrate of claim 17, further including an active device positioned over one or both of the following:
  a portion of one of the diamond strips; and
  a portion of one of the metal or metallic strips, wherein the active device includes a P-N junction.

20. The composite substrate of claim 19, wherein a ratio between a Coefficient of Thermal Expansion (CTE) of the composite substrate and a CTE of the active device is between 0.4 and 2; or between 0.5 and 1.8; or between 0.6 and 1.6; or between 0.7 and 1.4; or between 0.8 and 1.2.

21. The composite substrate of claim 19, wherein the alternating pattern of diamond strips and metal or metallic strips define a submount and the composite substrate further includes:
  a dielectric layer between the active device and at least a portion of the submount; and
  a conductor formed on the dielectric layer, said conductor in electrical continuity with a contact of the active device.

22. The composite substrate of claim 17, wherein each diamond strip has a length greater than a width of the diamond strip, and the length greater than a height of the diamond strip.

* * * * *

UNITED STATES PATENT AND TRADEMARK OFFICE
CERTIFICATE OF CORRECTION

PATENT NO. : 9,812,375 B2
APPLICATION NO. : 15/011805
DATED : November 7, 2017
INVENTOR(S) : Wen-Qing Xu et al.

Page 1 of 1

It is certified that error appears in the above-identified patent and that said Letters Patent is hereby corrected as shown below:

In the Claims

Column 18, Line 6, Claim 16, after "greater" insert -- than --

Column 18, Line 7, Claim 16, delete "that" and insert -- than --

Signed and Sealed this
Thirty-first Day of July, 2018

Andrei Iancu
*Director of the United States Patent and Trademark Office*